United States Patent
Meyer

(10) Patent No.: US 8,482,981 B2
(45) Date of Patent: Jul. 9, 2013

(54) METHOD OF FORMING AN INTEGRATED CIRCUIT WITH NAND FLASH ARRAY SEGMENTS AND INTRA ARRAY MULTIPLEXERS AND CORRESPONDING INTEGRATED CIRCUIT WITH NAND FLASH ARRAY SEGMENTS AND INTRA ARRAY MULTIPLEXERS

(75) Inventor: Steffen Meyer, Dresden (DE)

(73) Assignee: Qimonda AG, München (DE)

( * ) Notice: Subject to any disclaimer, the term of this patent is extended or adjusted under 35 U.S.C. 154(b) by 1116 days.

(21) Appl. No.: 12/129,765

(22) Filed: May 30, 2008

(65) Prior Publication Data

US 2009/0296473 A1    Dec. 3, 2009

(51) Int. Cl.
*G11C 11/34*    (2006.01)
(52) U.S. Cl.
USPC ............... 365/185.13; 365/189.02; 257/314
(58) Field of Classification Search
USPC .............. 365/63, 51, 185.13, 185.17, 189.02, 365/230.04; 257/314
See application file for complete search history.

(56) References Cited

U.S. PATENT DOCUMENTS

| | | | | |
|---|---|---|---|---|
| 5,315,541 A | * | 5/1994 | Harari et al. | 365/185.13 |
| 5,682,343 A | * | 10/1997 | Tomishima et al. | 365/63 |
| 5,923,605 A | * | 7/1999 | Mueller et al. | 365/230.03 |
| 5,969,990 A | * | 10/1999 | Arase | 365/185.25 |
| 6,377,504 B1 | * | 4/2002 | Hilbert | 365/230.03 |
| 6,507,515 B2 | * | 1/2003 | Taniguchi | 365/185.17 |
| 7,570,513 B2 | * | 8/2009 | Li et al. | 365/185.03 |
| 2001/0030884 A1 | * | 10/2001 | Frey et al. | 365/149 |
| 2004/0004860 A1 | * | 1/2004 | Abedifard | 365/185.11 |
| 2004/0165410 A1 | * | 8/2004 | Chevallier | 365/63 |
| 2004/0213045 A1 | * | 10/2004 | Nakai | 365/185.13 |
| 2005/0133852 A1 | * | 6/2005 | Shau | 257/315 |
| 2006/0197136 A1 | * | 9/2006 | Futatsuyama et al. | 257/314 |

* cited by examiner

*Primary Examiner* — Douglas King
(74) *Attorney, Agent, or Firm* — Murphy, Bilak & Homiller, PLLC

(57) ABSTRACT

The present invention provides an integrated circuit including N1 NAND flash array segments with N2 local bit lines, N1 intra array multiplexers and N2/2 global bit lines. Further, the present invention provides a method of producing an integrated circuit including N1 NAND flash array segments with N2 local bit lines, N1 intra array multiplexers and N2/2 global bit lines.

41 Claims, 6 Drawing Sheets

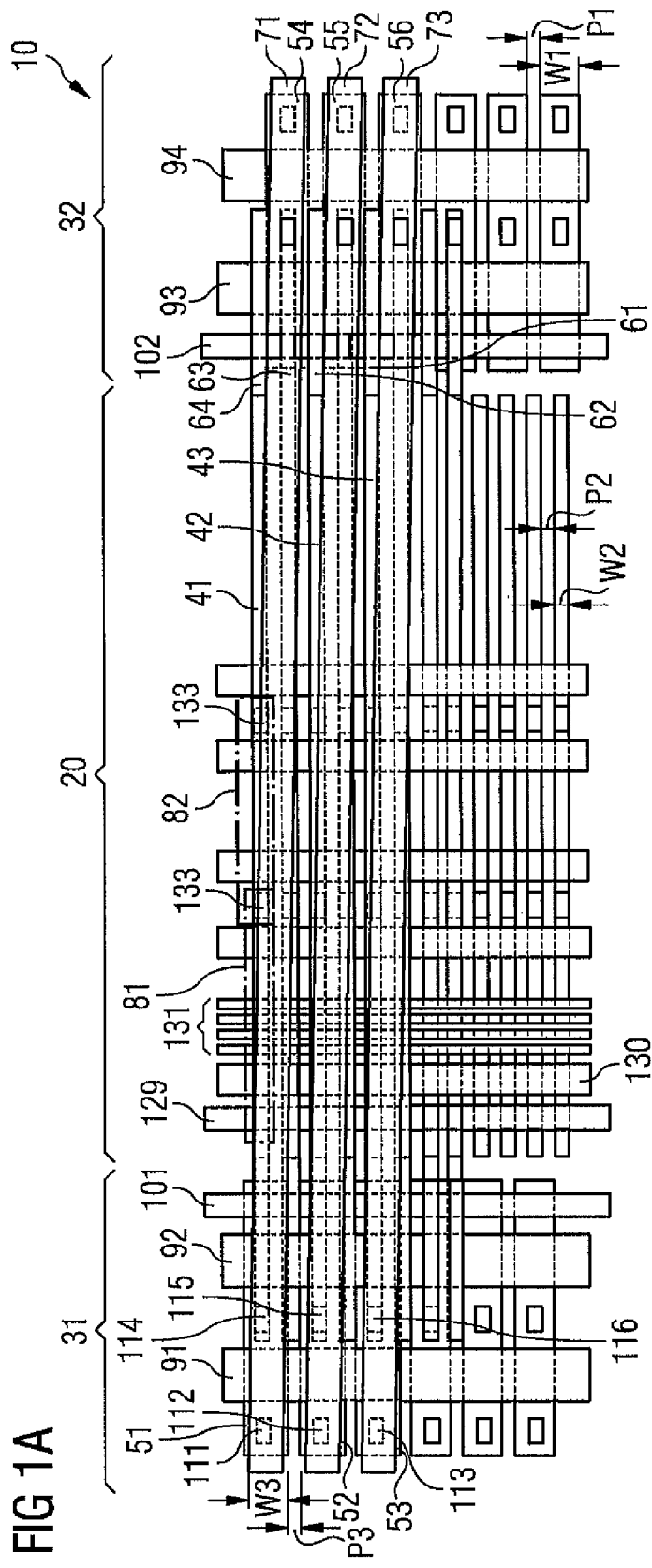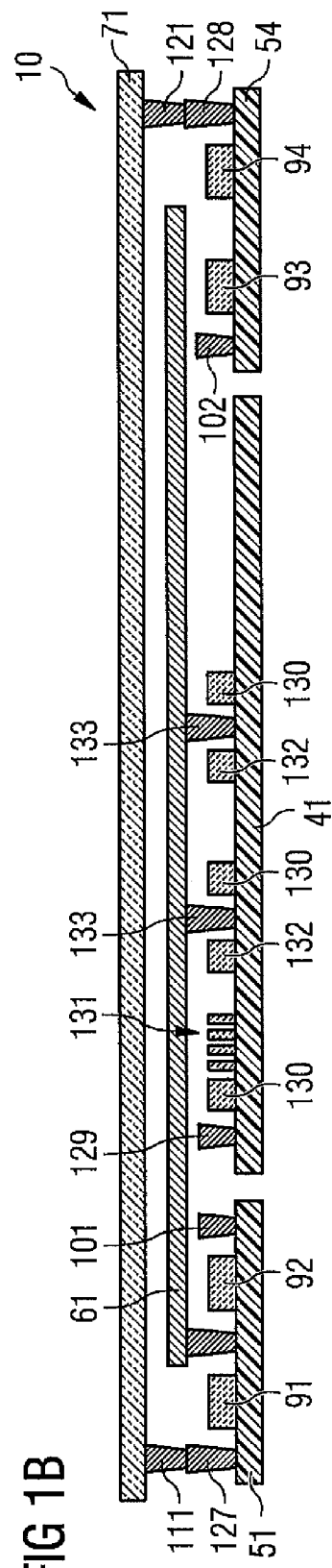

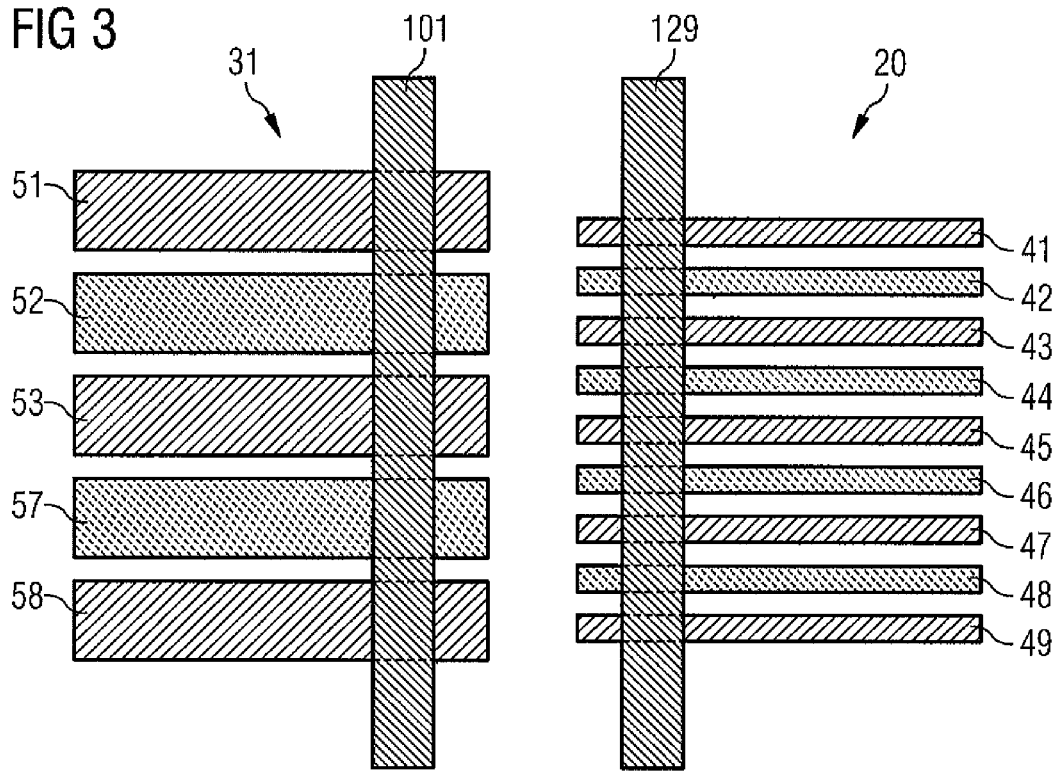
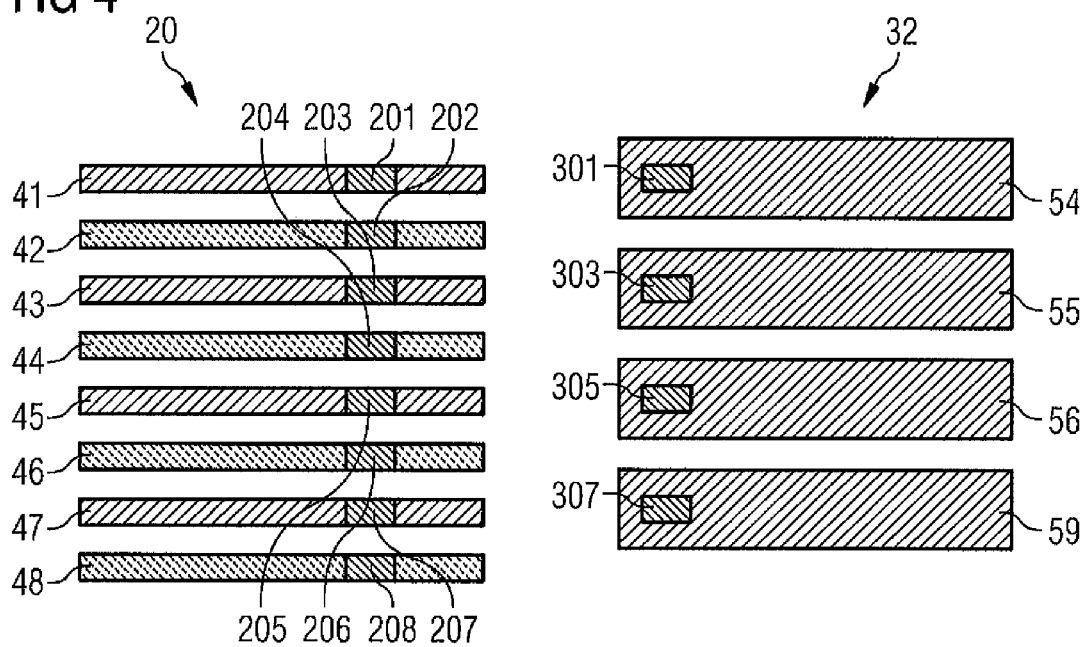

METHOD OF FORMING AN INTEGRATED CIRCUIT WITH NAND FLASH ARRAY SEGMENTS AND INTRA ARRAY MULTIPLEXERS AND CORRESPONDING INTEGRATED CIRCUIT WITH NAND FLASH ARRAY SEGMENTS AND INTRA ARRAY MULTIPLEXERS

BACKGROUND OF THE INVENTION

1. Field of the Invention

The present invention relates to a method of forming an integrated circuit with NAND flash array segments and intra array multiplexers and to a corresponding integrated circuit with NAND flash array segments and intra array multiplexers.

2. Related Art

A flash memory is a non-volatile computer memory that can be electrically erased and reprogrammed. E.g. each flash memory may store information in an array of floating-gate transistors, often called cells. One example for a flash memory is a NAND memory which uses tunnel injection for writing and tunnel release for erasing.

As manufactures increase the density of data storage in flash devices, the size of an individual memory cell is shrinking. Also, the distance between two adjacent memory cells decreases. Therefore, it is a challenge to provide a high cell density as well as a sufficient stability of its components.

BRIEF DESCRIPTION OF THE FIGURES

The invention can be better understood by referring to the following figures. The components in the figures are not necessarily to scale, emphasis instead being placed upon illustrating the principles of the invention. In the figures, like reference numerals designate corresponding parts throughout the different views.

FIG. 1a illustrates a schematic plain view of an embodiment of an integrated circuit and FIG. 1b shows a schematic cross section of the integrated circuit;

FIG. 3 illustrates a schematic plain view of an embodiment of a brute force double patterning process of forming active areas;

FIG. 4 illustrates a schematic plain view of an embodiment of a brute force double patterning process of forming contacts;

DETAILED DESCRIPTION

Figure 2:
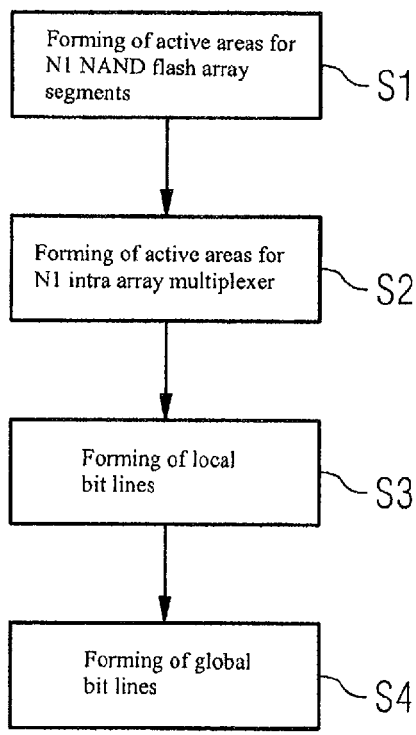
FIG. 2 shows a flow chart of a first embodiment of the method of forming an integrated circuit.

In the following description, reference is made to the accompanying drawings that form a part hereof, and in which is shown by way of illustration one or more specific implementations in which the invention may be practiced. It is to be understood that other implementations may be utilized and structural changes may be made without departing from the scope of this invention.

FIG. 1a illustrates a schematic plain view of an embodiment of an integrated circuit 10 and FIG. 1b shows a schematic cross section of the integrated circuit 10.

The integrated circuit 10 includes a number N1 of NAND flash array segments 20 and N1 intra array multiplexers 31, 32, each NAND flash array segment 20 is surrounded by a first and a second half 31, 32 of the corresponding multiplexer. Reference sign 31 designates the first half or left half of the corresponding multiplexer and reference sign 32 designates the second half or right half of the corresponding multiplexer.

Each NAND flash array segment 20 has a number N2 of rows or active areas 41-43. Further, the active areas 51-56 of the intra array multiplexers 31, 32 may be formed by double patterning and may have a 3F width W1 and a 1F pitch P1. Each row 41-43 or active area of the corresponding NAND flash array segment 20 has a local bit line 61-64 connected. The rows 41-43 may be formed by double patterning and may have a 1F width W2 and a 1F pitch P2 to each other.

The integrated circuit 10 has global bit lines 71-73 and local bit lines 61-64. At least one global bit line 71-73 is connected to at least two local bit line 61-64. Preferably, a respective global bit line 71-73 may be connected to at least two associated or neighbouring local bit lines 61-64.

Preferably, the integrated circuit 10 further includes a number N4 of global bit lines, in particular with N4=½N2, the $i^{th}$ global bit line 71-73 is able to be connected to the $(2i-1)^{th}$ local bit line 61, 63 and the $(2i)^{th}$ local bit line 62, 64, i∈[1, ..., N4], the global bit lines 71-73 are formed by double patterning and have a 2F width W3 and a 2F pitch P3 to each other.

That NAND flash array segment 20 forms a NAND flash array. In contrast to conventional NAND flash array segments, the total number of bit lines connected to the periphery of the NAND flash array is decreased, because not every row of the corresponding segment is coupled by a bit line connected to said periphery. In contrast, only the global bit lines 71-73 may be connected to the periphery, said global bit lines multiplexed to the local bit lines 61-64 coupling a respective row or string. Said multiplexing within said integrated circuit 10 or NAND flash array is provided by means of said N1 intra array multiplexers. The phrase intra within intra array multiplexer indicates that the intra array multiplexers are incorporated or integrated within the integrated circuit 10.

That NAND flash array may have 32 to 128 word lines or rows forming a string or NAND string. Said string has a respective select transistor at its beginning and at its end. On the one end, said string is connected to source, and on the other end it is connected to bit lines. Said string structure recurs and, therefore, forms a NAND flash array segment 20. After a predefined number of said strings, e.g. several hundreds or thousands, there is arranged an intra array multiplexer.

Further, each row 41-43 can have a number N3 of NAND strings 81, 82, wherein the corresponding local bit line 61-64 of the respective rows 41-43 is connected to the number N3 of NAND strings 81, 82. To increase the legibility of FIGS. 1a and 1b not all elements shown are comprised with reference signs.

Further, the first half 31 of the intra array multiplexer can have a first and a second transistor 91, 92 for activating the $(2i-1)^{th}$ local bit line 41, 43, respectively. The first transistor 91 is able to connect the $i^{th}$ global bit line 71 with the $(2i-1)^{th}$ local bit line 41, respectively. E.g. the first transistor 91 is able to connect the first global bit line 71 with the first local bit line 41.

Further, the second transistor 92 can be able to connect the $i^{th}$ global bit line 71 with an inhibit voltage 101, respectively. E.g. the second transistor 92 is able to connect the first global bit line 71 with the inhibit voltage supply 101.

The second half 32 of the multiplexer can have a third and a fourth transistor 93, 94 for activating the $(2i)^{th}$ local bit line 42, 44, respectively. In particular, the third transistor 93 is able to connect the $(2i)^{th}$ local bit line 62 to an inhibit voltage supply 102, respectively. E.g. the third transistor 93 can be able to connect the second local bit line 42 with the inhibit voltage supply 102.

Furthermore, the fourth transistor 94 may be able to connect the $i^{th}$ global bit line 91 with the $(2i)^{th}$ local bit line 62, respectively. E.g. the fourth transistor 94 can be able to connect the first global bit line 71 with the second local bit line 62.

The global bit lines 71-73 can be arranged over all N1 flash array segments 20, wherein the local bit lines 61-63 are arranged over the corresponding NAND flash array segment 20.

The first half 31 of the intra array multiplexer can have N4 global bit line contacts 111-113, wherein the $i^{th}$ global bit line contact 111 can connect the $i^{th}$ global bit line 71 with the first transistor 91, respectively. E.g. the first global bit line contact 111 can connect the first global bit line 71 with the first transistor 91.

The first half 31 of the intra array multiplexer can have N4 local bit line contacts 114-116, wherein the $i^{th}$ local bit line contact 114 can connect the $(2i-1)^{th}$ local bit line 61 with the first transistor 91, respectively. E.g. the first local bit line contact 114 can connect the first local bit line 61 with the first transistor 91.

Further, the second half 32 of the intra array multiplexer can have N4 global bit line contacts 121-123, wherein the $j^{th}$ global bit line contact 121, j∈[1, . . . , N4], can connect the $i^{th}$ global bit line 71 with the fourth transistor 94, respectively. E.g. the first global bit line contact 121 can connect the first global bit line 71 with the fourth transistor 94.

Furthermore, the second half 32 of the intra array multiplexer can have a number N4 of local bit line contacts 124-126, wherein the $i^{th}$ local bit line contact 124 can connect the $(2i)^{th}$ local bit line 62 with the fourth transistor 93, respectively. E.g. the first local bit line contact 124 can connect the second local bit line 62 with the fourth transistor 93.

Also, contacts 133 can be provided over each NAND string 81, 82 for connecting a corresponding bit line (not shown) with the underlying active area 41.

A NAND flash array segment 20 comprises a source line 129, a ground select transistor 130, a number of word lines 131 and a bit line select transistor 132. Without loss of generality, this is shown in FIG. 1b for the first row of the integrated circuit.

FIG. 2 shows a flow chart of an embodiment of a method of forming an integrated circuit 10. In the following, the method of forming an integrated circuit is explained with reference to the block diagram of FIG. 2 referring to the schematic plain view of FIG. 1a and the schematic cross section of FIG. 1b.

The embodiment of the method of forming an integrated circuit 10 has the method steps S1-S4 as shown in FIG. 2:
Step S1:
    Active areas 41-43 for a number N1 of NAND flash segments 20 are formed by double patterning respectively a double patterning process, wherein each NAND flash segment 20 has a number N2 of rows 41-43 with a 1F width W2 and a 1F pitch P2 to each other.

Step S2:
    Active areas 51-56 for a number N1 of intra array multiplexers 31, 32 are formed by double patterning respectively a double patterning process, wherein the active areas 51-56 have a 3F width W1 and a 1F pitch P1 to each other
Step S3:
    A local bit line 61-63 is formed over each row 41-43 respectively, each local bit line having a 1F width W2 and a 1F pitch P2 to each other.
Step S4:
    A number N4 of global bit lines 71-73, $$N4 = \frac{1}{2}N2,$$

is formed with a 2F width W3 and a 2F pitch P3 to each other by double patterning respectively a double patterning process such that a $i^{th}$ global bit line 71-73 is able to be connected to a $(2i-1)^{th}$ local bit line 61, 63 and a $(2i)^{th}$ local bit line, i∈[1, . . . , N4]. E.g. the first global bit line 71 is able to be connected to the first local bit line 61 and the second local bit line 62. Further, the second global bit line 72 can be able to be connected to the third local bit line 63 and the fourth local bit line 64.

Further to method steps S1-S4, the method of forming an integrated circuit 10 can have the following embodiments:

Each NAND flash array segment 20 can be surrounded by the first and second halves 31, 32 of the corresponding intra array multiplexer. Further, a number N3 of NAND strings 81, 82 can be formed within each row 41-43, wherein the formed N3 NAND strings 81, 82 can be connected with the corresponding local bit lines 61-61. E.g. the first NAND string 81 and the second NAND string 82 within the first row 41 can be connected to the first local bit line 61.

Further, the first half 31 of the intra array multiplexer can be provided with a first and a second transistor 91, 92 for activating the $(2i-1)^{th}$ local bit line 41, 43, respectively. In this regard, the first transistor 91 can be formed to be able to connect the $i^{th}$ global bit line 71 with the $(2i-1)^{th}$ local bit line 41, respectively. E.g. the transistor 91 can be able to connect the first global bit line 71 with the first local bit line 41.

The second transistor 92 can be formed to be able to connect the $(2i-1)^{th}$ global bit line 71 with an inhibit voltage supply 101, respectively. E.g. the second transistor 92 is formed to be able to connect the first global bit line 71 with the inhibit voltage supply 101.

The second half 32 of the intra array multiplexer can be provided with a third and a fourth transistor 93, 94 for activating the $(2i)^{th}$ local bit line 42, 44, respectively the even-numbered local bit line 42, 44, respectively. In this regard, the third transistor 93 can be formed to be able to connect the $(2i)^{th}$ local bit line 62 with an inhibit voltage supply 102, respectively. E.g. the third transistor 93 can be formed to be able to connect the second local bit line 62 with the inhibit voltage supply 102.

Further, the fourth transistor 94 can be formed to be able to connect the $i^{th}$ global bit line 71 with the $(2i)^{th}$ local bit line 62, respectively. E.g. the fourth transistor 94 can be formed to connect the first global bit line 71 with the second local bit line 62.

The global bit lines 71-73 can be arranged over all N1 NAND flash array segments 20, wherein the local bit lines 61-63 can be arranged over only the corresponding NAND flash array segments. E.g. the first local bit line 61 is arranged only over the corresponding NAND flash array segment 20. Further, the integrated circuit 10 can be formed as a memory device for a memory circuit.

Further, the active areas 41-43 for the N1 NAND flash segments 20 and the active areas 51-56 for the N1 intra array multiplexers 31, 32 can be formed with one double patterning process at the same time or simultaneously.

Also, the first half 31 of the intra array multiplexer can be provided with N4 global bit line contacts 111-113, wherein the $i^{th}$ global bit line contact 111 can connect the $i^{th}$ global bit line 71 with the first transistor 91, respectively. E.g. the first global bit line contact 111 can connect the first global bit line 71 with the first transistor 91.

Further, the first half 31 of the intra array multiplexer can be provided with N4 local bit line contacts 114-116, wherein the $i^{th}$ local bit line contact 114 can connect the $(2i-1)^{th}$ local bit line with the first transistor 91, respectively. That means that the N4 local bit line contacts 114-116 can connect the odd-numbered (by means of parameter i) bit lines 61, 63. E.g. the first local bit line contact 114 can connect the first local bit line 61 with the first transistor 91.

Further, the second half 32 of the intra array multiplexer can be provided with a number N4 of global bit line contacts 121-123, the $j^{th}$ global bit line contact, $j \in [1, \ldots, N4]$, can connect the $i^{th}$ global bit line 71 with the fourth transistor 94, respectively. E.g. the first global bit line contact 121 can connect the first global bit line 71 with the fourth transistor 94.

Further, the second half 32 of the intra array multiplexer can be provided with a number N4 of local bit line contacts 124-126, wherein the $i^{th}$ local bit line contact 124 can connect the $(2i)^{th}$ local bit line 62 with the fourth transistor 94, respectively. E.g. the first local bit line contact 124 can connect the second local bit line 62 with the fourth transistor 94.

Furthermore, the first half 31 of the intra array multiplexer can be provided with N4 local bit line contacts 114-116, the $i^{th}$ bit line contact 114 can connect the $(2i-1)^{th}$ local bit line 61 with the first transistor 91, the second half 32 of the intra array multiplexer can be provided with N4 local bit line contacts 124-126, the $i^{th}$ local bit line contact 124 can connect the $(2i)^{th}$ local bit line 62 with the fourth transistor 94, wherein the local bit line contacts 114-116; 124-126 are structured as stackered CB chain by lithography or by double patterning.

Further, the N4 global bit line contacts 111-113 at the first half 31 of the intra array multiplexer and the N4 global bit line contacts 121-123 at the second half 32 of the intra array multiplexer can be formed by a double patterning process, wherein the global bit line contacts 111-113; 121-123 can be landed on a contact 127, 128 processed within a local bit line 114-116; 124-126 structuring processor on the respective local bit line 61-64.

FIG. 3 illustrates a schematic plain view of an embodiment of the brute force double patterning process of forming active areas 51-56 of a first half 31 of an intra array multiplexer and active areas 41-49 of an NAND array segment 20. In a first sub-step of the brute force double patterning process, the active areas 51, 53, 58 and 41, 43, 45, 47, 49 can be formed simultaneously. In a second sub-step of the brute force double patterning process, the active areas 52, 57 and 42, 44, 46 and 48 can be formed simultaneously.

FIG. 4 illustrates a schematic plain view of an embodiment of the brute force double patterning process of forming contacts 201-208 for connecting a corresponding bit line (not shown) with the underlying active area 41-48 and local bit line contacts 301, 303, 305, 307 of the active areas 54, 55, 56, 59 of the second half 32 of the intra array multiplexer.

In a first sub-step of the brute force double patterning process, the contacts with an odd number, namely 201, 203, 205, 207, 301, 303, 305 and 307, are formed simultaneously.

In a second sub-step, the contacts with an even number, namely 202, 204, 206 and 208, are formed simultaneously.

The sequence of the first and second sub-steps of the brute force double patterning process as described with reference to FIGS. 3 and 4 can be changed.

Figure 5A:
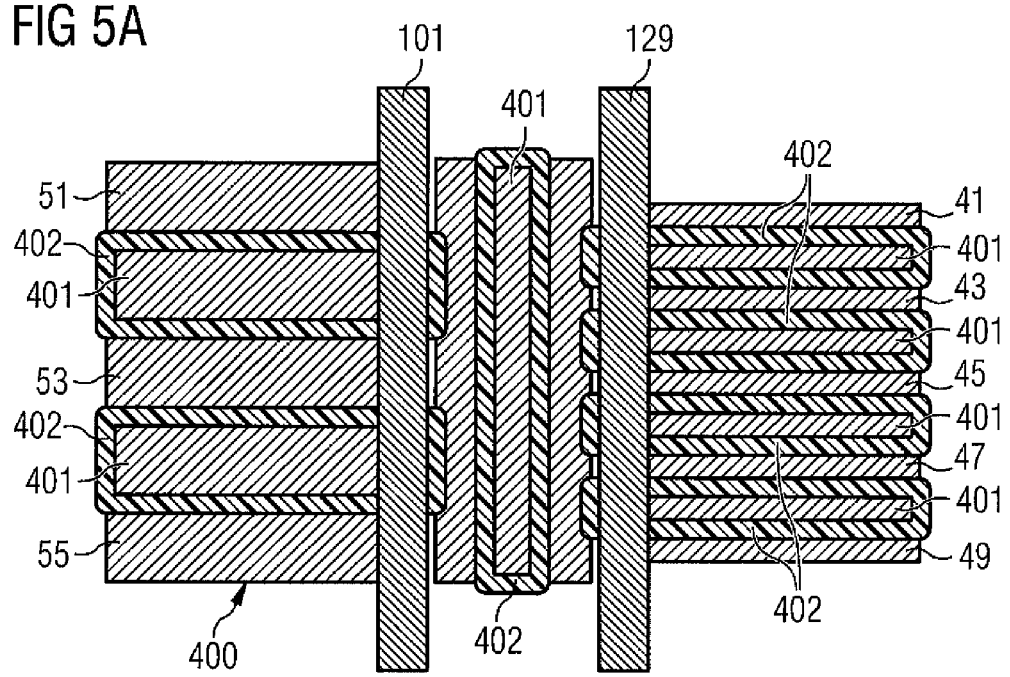
FIGS. 5a and 5b illustrate schematic plain views of embodiments of a pitchfrag double patterning process of forming active areas.
Figure 5B:
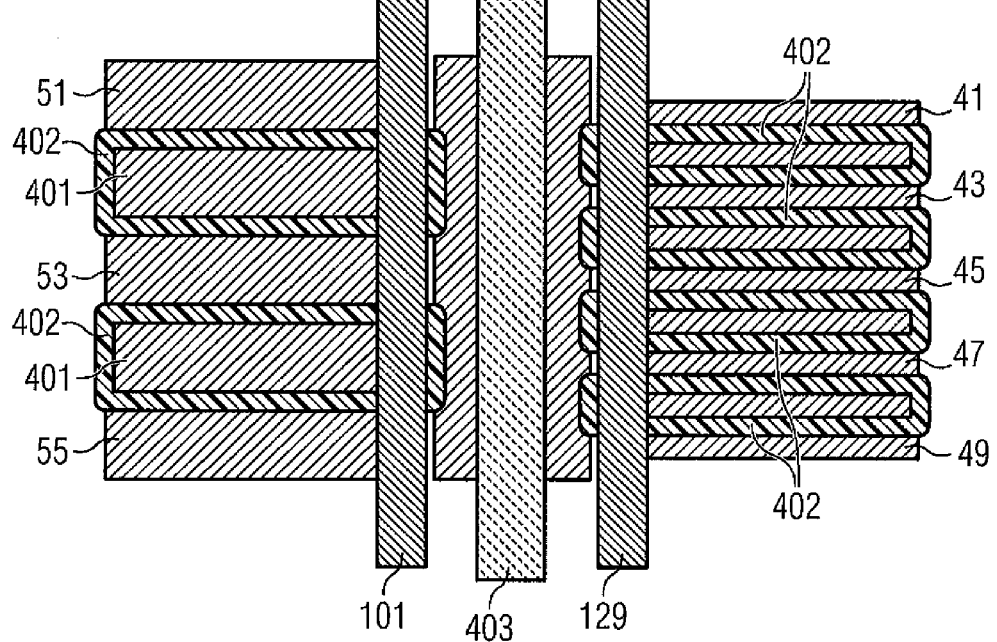

FIGS. 5a and 5b show schematic plain views of embodiments of a pitchfrag double patterning process of forming active areas 51-55 of the first half 31 of an intra array multiplexer and active areas 41-49 of a NAND flash array segment 20.

Before processing the pitchfrag double patterning, an active area 400 is provided which forms the basis for the intra array multiplexers 31, 32 and the NAND flash array 27.

Without loss of generality, the FIGS. 5a and 5b show only the first half 31 of one intra array multiplexer and one NAND flash array segment 20.

After providing the active area 400, carrier layers 401 used as a spacer for building an isolation area for the active areas are processed. Subsequently to the processing of the carrier layers 401, spacer layers 402 are processed on the respective carrier layers 401. By means of the spacer layers 402 isolation areas between neighbouring active areas of the first half 31 of the intra array multiplexer and the NAND flash array segment 20 can be processed.

Alternatively for dividing the first half 31 of the intra array multiplexer and the NAND flash array segment 20 as depicted in FIG. 5a, a trim mask 403 as shown in FIG. 5b can be used. The trim mask may be a hard mask.

Figure 6A:
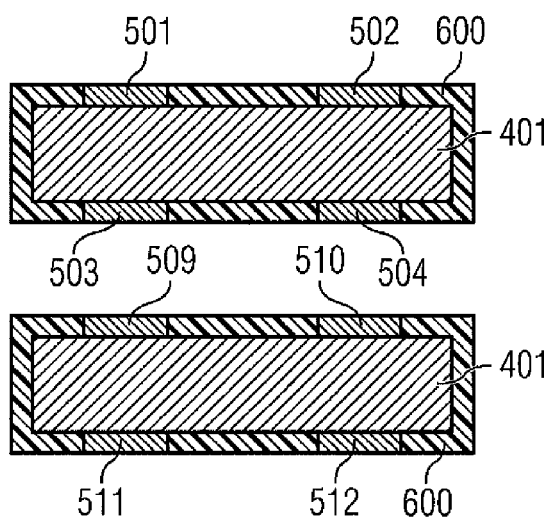
FIGS. 6a and 6b illustrate schematic plain views of further embodiments of a pitchfrag double patterning process of forming active areas using a trim mask.
Figure 6B:
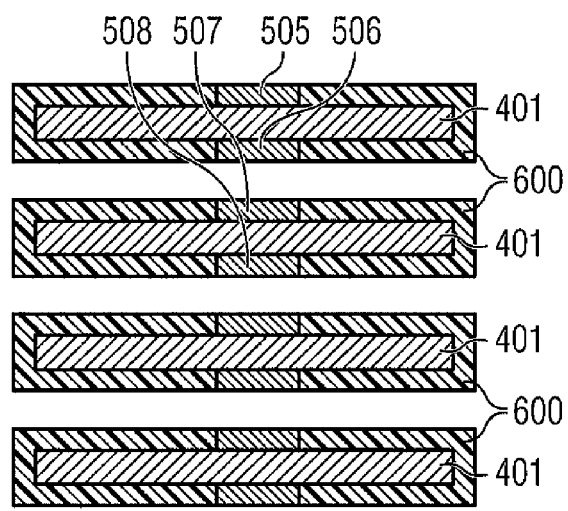

In an analogous way, the FIGS. 6a and 6b show schematic plain view of embodiments of a pitchfrag double patterning process of forming contacts 501-516.

Further, FIGS. 6a and 6b show the use of a CB mask 600 for defining the length of the contacts 501-516.

Figure 7A:
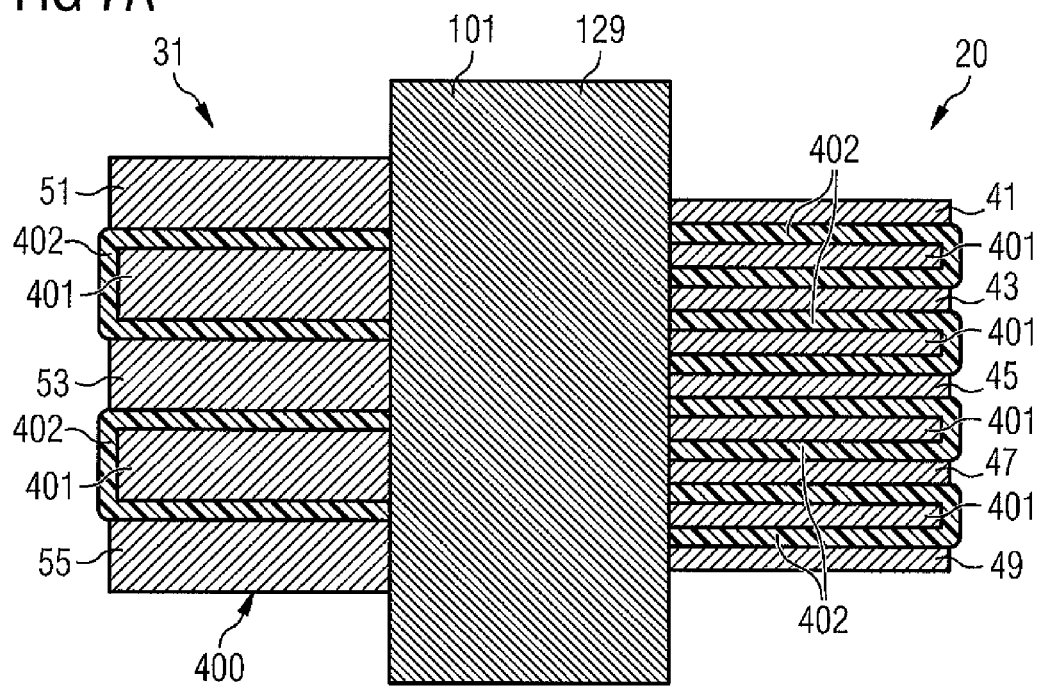
FIGS. 7a and 7b illustrate alternative layouts with a joint of a source line and an inhibit voltage supply.
Figure 7B:
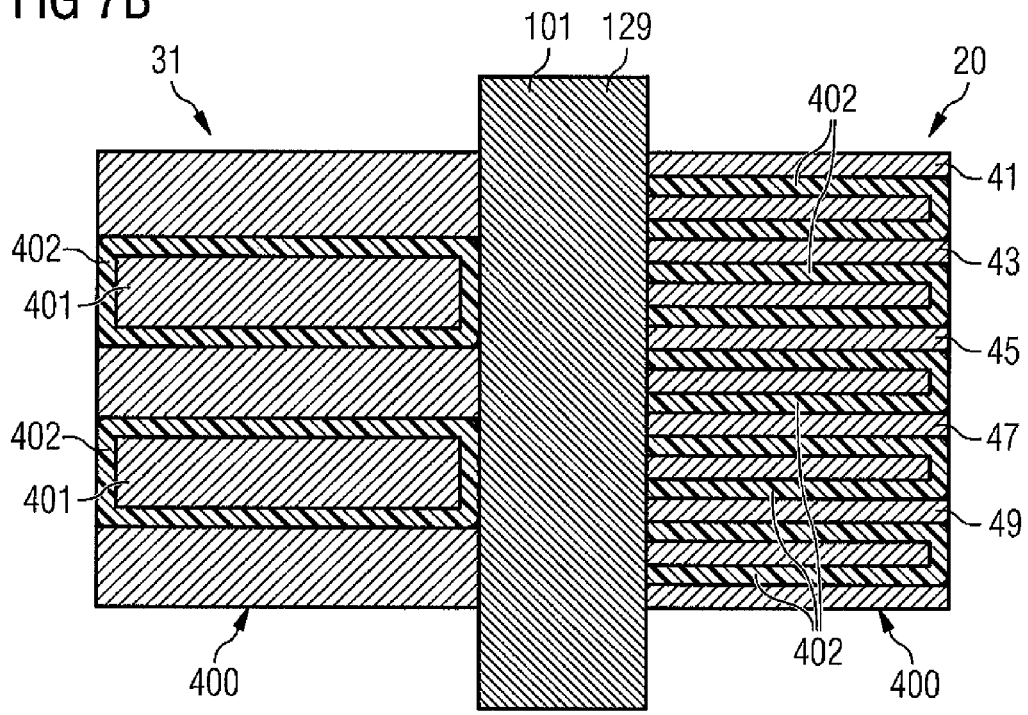

As an alternative to the embodiment of FIG. 5a, the FIGS. 7a and 7b show alternative layouts for an integrated circuit as shown in FIGS. 1a and 1b with a joint of source line 129 and inhibit voltage supply 101 processed by a pitchfrag double patterning process.

Figure 8:
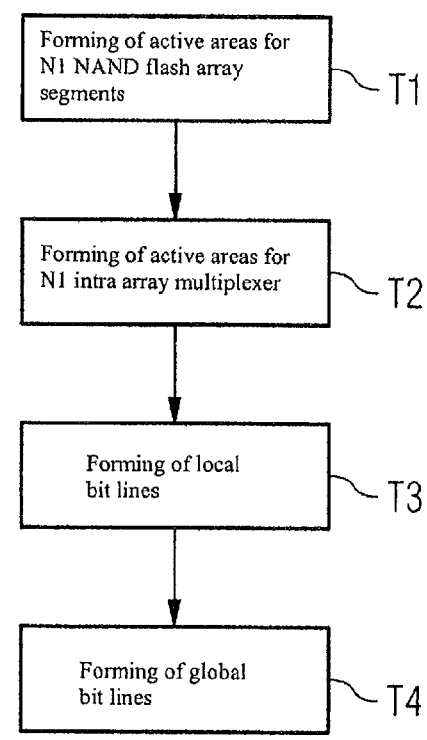
FIG. 8 shows a flow chart of a second embodiment of the method of forming an integrated circuit.

FIG. 8 shows a flow chart of a second embodiment of a method of forming an integrated circuit 10. In the following, the method of forming an integrated circuit is explained with reference to the block diagram of FIG. 8 referring to the schematic plain view of FIG. 1a and the schematic cross section of FIG. 1b.

The embodiment of the method of forming an integrated circuit 10 has the method steps T1-T4 as shown in FIG. 8:

Step T1:

Active areas 41-43 for a number N1 of NAND flash segments 20 are formed, wherein each NAND flash segment 20 has a number N2 of rows 41-43 with a 1F width W2 and a 1F pitch P2 to each other.

Step T2:

Active areas 51-56 for a number N1 of intra array multiplexers 31, 32 are formed, wherein the active areas 51-56 have width W1 greater than 2F and a pitch P1 to each other smaller than 2F.

Step T3:

A local bit line 61-63 is formed over each row 41-43 respectively, each local bit line having a 1F width W2 and a 1F pitch P2 to each other.

Step T4:

A number N4 of global bit lines 71-73, $$N4 = \frac{1}{2}N2,$$

is formed with a 2F width W3 and a 2F pitch P3 to each other such that a $i^{th}$ global bit line 71-73 is able to be connected to a $(2i-1)^{th}$ local bit line 61, 63 and a $(2i)^{th}$ local bit line, $i \in [1, \ldots, N4]$. E.g. the first global bit line 71 is able to be connected to the first local bit line 61 and the second local bit line 62. Further, the second global bit line 72 can be able to be connected to the third local bit line 63 and the fourth local bit line 64.

The invention claimed is:

1. An integrated circuit comprising:
a number N1 of NAND flash array segments each having a number N2 of active areas, the active areas of the NAND flash array segments having about 1F width and about 1F pitch to each other;
N1 intra array multiplexers each having a plurality of active areas, the active areas of the intra array multiplexers having a width greater than 2F and a pitch to each other smaller than 2F;
a plurality of local bit lines connected to the active area of the each NAND flash array segment;
a number N4 of global bit lines having a 2F width and a 2F pitch to each other, at least one global bit line connected to at least two of the local bit lines; and
wherein F is a minimum feature size of the integrated circuit.

2. The integrated circuit of claim 1, wherein $$N4 = \frac{1}{2}N2,$$

an $i^{th}$ one of the global bit lines is configured to be connected to a $(2i-1)^{th}$ one of the local bit lines and a $(2i)^{th}$ one of the local bit lines, and $i \in [1, \ldots, N4]$.

3. The integrated circuit of claim 1, wherein the active areas of the multiplexers, the active areas of the NAND flash array segments and the global bit lines are formed by double patterning.

4. The integrated circuit of claim 1, wherein the active areas of the multiplexers have a 3F width and a 1F pitch to each other.

5. The integrated circuit of claim 1, wherein each NAND flash array segment is surrounded by a first and a second half of the corresponding multiplexer.

6. The integrated circuit of claim 5, wherein the first half of each multiplexer has a first and a second transistor for activating a $(2i-1)^{th}$ one of the local bit lines.

7. The integrated circuit of claim 6, wherein each first transistor is configured to connect an $i^{th}$ one of the global bit lines with the corresponding $(2i-1)^{th}$ local bit line.

8. The integrated circuit of claim 6, wherein each second transistor is configured to connect an $i^{th}$ one of the global bit lines with an inhibit voltage supply.

9. The integrated circuit of claim 6, wherein the second half of each multiplexer has a third and a fourth transistor for activating an $(2i)^{th}$ one of the local bit lines.

10. The integrated circuit of claim 9, wherein each third transistor is configured to connect the $(2i)^{th}$ local bit line with an inhibit voltage supply.

11. The integrated circuit of claim 9, wherein each fourth transistor is configured to connect an $i^{th}$ one of the global bit line with the corresponding $(2i)^{th}$ local bit line.

12. The integrated circuit of claim 11, wherein the second half of each multiplexer has a number N4 of global bit line contacts, wherein an $j^{th}$ one of the global bit line contacts connects the $i^{th}$ global bit line with the corresponding fourth transistor, and wherein $j \in [1, \ldots N4]$.

13. The integrated circuit of claim 11, wherein the second half of each multiplexer has a number N4 of local bit line contacts, and wherein an $i^{th}$ one of the local bit line contacts connects the corresponding $(2i)^{th}$ local bit line with the corresponding fourth transistor.

14. The integrated circuit of claim 7, wherein the first half of each multiplexer has a number N4 of global bit line contacts, and wherein an $i^{th}$ one of the global bit line contacts connects the $i^{th}$ global bit line with the corresponding first transistor.

15. The integrated circuit of claim 7, wherein the first half of each multiplexer has a number N4 of local bit line contacts, and wherein an $i^{th}$ one of the local bit line contacts connects the corresponding $(2i-1)^{th}$ local bit line with the corresponding first transistor.

16. The integrated circuit of claim 1, wherein each active area of the NAND flash array segments has a number N3 of NAND strings, and wherein the corresponding local bit line connected to the respective active area is connected to the N3 NAND strings.

17. The integrated circuit of claim 1, wherein the global bit lines are arranged over all N1 NAND flash arrays segments.

18. The integrated circuit of claim 1, wherein the local bit lines are arranged over the corresponding NAND flash array segment.

19. A method of forming an integrated circuit, comprising:
forming active areas for a number N1 of NAND flash segments, each NAND flash segment having a number N2 of rows of the active areas with a 1F width and a 1F pitch to each other;
forming active areas for N1 intra array multiplexers, the active areas of the multiplexers having a width greater than 2F and a pitch to each other smaller than 2F;
forming a local bit line over each row of the NAND flash segments; and
forming a number N4 of global bit lines, $$N4 = \frac{1}{2}N2,$$

with a 2F width and a 2F pitch to each other, wherein F is a minimum feature size of the integrated circuit.

20. The method of claim 19, wherein an $i^{th}$ one of the global bit lines is configured to be connected to a $(2i-1)^{th}$ one of the local bit lines and a $(2i)^{th \ one \ of \ the}$ local bit lines, and wherein $i \in [1, \ldots, N4]$.

21. The method of claim 19, wherein the active areas of the intra array multiplexers, the active areas for the N1 NAND flash segments and the N4 global bit lines are formed by double patterning.

22. The method of claim 19, wherein the active areas of the multiplexers have a 3F width and a 1F pitch to each other.

23. The method of claim 19, wherein each NAND flash segment is surrounded by first and second halves of the corresponding intra array multiplexer.

24. The method of claim 23, wherein the first half of each multiplexer is provided with a first and a second transistor for activating a $(2i-1)^{th}$ one of the local bit lines.

25. The method of claim 24, wherein each first transistor is configured to connect an $i^{th}$ one of the global bit lines with the corresponding $(2i-1)^{th}$ local bit line.

26. The method of claim 24, wherein each second transistor is configured to connect an $i^{th}$ one of the global bit lines with an inhibit voltage supply, respectively.

27. The method of claim 25, wherein the first half of each multiplexer is provided with a number N4 of global bit line contacts, and wherein an $i^{th}$ one of the global bit line contacts connects the $i^{th}$ global bit line with the corresponding first transistor.

28. The method of claim 25, wherein the first half of each multiplexer is provided with a number N4 of local bit line contacts, and wherein an $i^{th}$ one of the local bit line contacts connects the corresponding $(2i-1)^{th}$ local bit line with the corresponding first transistor.

29. The method of claim 23, wherein the second half of each multiplexer is provided with a third and a fourth transistor for activating a $(2i)^{th}$ one of the local bit lines.

30. The method of claim 29, wherein the third transistor is configured to connect the $(2i)^{th}$ local bit line with an inhibit voltage supply.

31. The method of claim 29, wherein the fourth transistor is configured to connect an $i^{th}$ one of the global bit lines with the corresponding $(2i)^{th}$ local bit line.

32. The method of claim 31, wherein the second half of each multiplexer is provided with a number N4 of global bit line contacts, wherein an $j^{th}$ one of the global bit line contacts connects the $i^{th}$ global bit line with the corresponding fourth transistor, and wherein $j \in [1, \ldots N4]$.

33. The method of claim 31, wherein the second half of each multiplexer is provided with a number N4 of local bit line contacts, and wherein an $i^{th}$ one of the local bit line contacts connects the corresponding $(2i)^{th}$ local bit line with the corresponding fourth transistor.

34. The method of claim 19, wherein a number N3 of NAND strings are formed within each row, and wherein the N3 NAND strings are connected to the corresponding local bit line.

35. The method of claim 19, wherein the global bit lines are arranged over all N1 NAND flash segments.

36. The method of claim 19, wherein the local bit lines are arranged over the corresponding NAND flash segment.

37. The method of claim 19, wherein the integrated circuit is formed as a memory device.

38. The method of claim 19, wherein the active areas for the N1 NAND flash segments and the active areas for the N1 intra array multiplexers are formed with one double patterning process simultaneously.

39. The method of claim 19, wherein the first half of the multiplexer is provided with N4 local bit line contacts, the $i^{th}$ local bit line contact connecting the $(2i-1)^{th}$ local bit line with the first transistor, the second half of the multiplexer is provided with N4 local bit line contacts, the $i^{th}$ local bit line contact connecting the $(2i)^{th}$ local bit line with the fourth transistor, wherein the local bit line contacts are structured as stackered CB chain by lithography or by double patterning.

40. The method of claim 19, wherein N4 global bit line contacts are formed at the first half of the multiplexer, the $i^{th}$ global bit line contact connecting the $i^{th}$ global bit line with a first transistor, and N4 global bit line contacts are formed at the second half of the multiplexer, the $j^{th}$ global bit line contact connecting the $i^{th}$ global bit line with a fourth transistor, $j \in [1, \ldots N4]$, by a double patterning process, wherein the global bit line contacts are landed on a contact processed during a local bit lines structuring process or on the respective local bit line.

41. The method of claim 19, wherein the double patterning is a brute force process or a pitchfrag process.

* * * * *

UNITED STATES PATENT AND TRADEMARK OFFICE
CERTIFICATE OF CORRECTION

PATENT NO.        : 8,482,981 B2
APPLICATION NO.   : 12/129765
DATED             : July 9, 2013
INVENTOR(S)       : Steffen Meyer It is certified that error appears in the above-identified patent and that said Letters Patent is hereby corrected as shown below:

In the Claims

Column 8, line 57 (claim 20, line 3) please change "a $(2i)^{\text{th one of the}}$" to -- a $(2i)^{\text{th}}$ one of the --

Signed and Sealed this
Eighteenth Day of February, 2014

Michelle K. Lee
*Deputy Director of the United States Patent and Trademark Office*